(12) United States Patent
Kumar et al.

(10) Patent No.: US 8,101,469 B2
(45) Date of Patent: Jan. 24, 2012

(54) METHOD OF FORMING MONOLITHIC CMOS-MEMS HYBRID INTEGRATED, PACKAGED STRUCTURES

(75) Inventors: G. Krishna Kumar, Troy, MI (US); Nishit A. Choksi, Troy, MI (US); Joseph M. Chalil, Shelby Township, MI (US)

(73) Assignee: Advanced Microfab, LLC, Ann Arbor, MI (US)

( * ) Notice: Subject to any disclaimer, the term of this patent is extended or adjusted under 35 U.S.C. 154(b) by 0 days.

(21) Appl. No.: 12/732,689

(22) Filed: Mar. 26, 2010

(65) Prior Publication Data

US 2011/0003421 A1 Jan. 6, 2011

Related U.S. Application Data

(63) Continuation-in-part of application No. 12/497,107, filed on Jul. 2, 2009.

(51) Int. Cl.
*H01L 21/44* (2006.01)

(52) U.S. Cl. ............ 438/123; 438/51; 438/55; 438/106; 438/E21.002

(58) Field of Classification Search ............... 438/25–26, 438/33, 51, 55, 106–127; 257/676
See application file for complete search history.

(56) References Cited

U.S. PATENT DOCUMENTS

| | | | | |
|---|---|---|---|---|
| 5,422,513 A | * | 6/1995 | Marcinkiewicz et al. | .... 257/668 |
| 5,717,631 A | | 2/1998 | Carley et al. | |
| 5,998,859 A | * | 12/1999 | Griswold et al. | ............ 257/679 |
| 6,060,336 A | | 5/2000 | Wan | |
| 6,154,366 A | | 11/2000 | Ma et al. | |
| 6,403,463 B1 | | 6/2002 | Suyama | |
| 6,555,906 B2 | | 4/2003 | Towle et al. | |
| 6,759,270 B2 | | 7/2004 | Infantolino et al. | |

(Continued)

OTHER PUBLICATIONS

J. Smith et al.; "Embedded micromechanical devices for the monolithic integration of MEMS with CMOS", Proc. IEDM '95, pp. 609-612, 1995.

(Continued)

*Primary Examiner* — Dung A. Le
(74) *Attorney, Agent, or Firm* — Gifford, Krass, Sprinkle, Anderson & Citkowski, P.C.

(57) ABSTRACT

A method of forming Monolithic CMOS-MEMS hybrid integrated, packaged structures includes the steps of providing: providing at least one semiconductor substrate having a CMOS device area including dielectric layers and metallization layers; applying at least one protective layer overlying the CMOS device area; forming at least one opening on the protective layer and patterning the dielectric and metallization layers to access the semiconductor substrate; forming at least one opening on the semiconductor substrate by etching the dielectric and metallization layers; applying at least one filler layer in the at least one opening on the semiconductor substrate; positioning at least one chip on the filler layer, the chip including a prefabricated front face and a bare backside; applying a first insulating layer covering the front face of the chip providing continuity from the semiconductor substrate to the chip; forming at least one via opening on the insulating layer covering the chip to access at least one contact area; applying at least one metallization layer overlying the insulating layer on the substrate and the chip connecting the metallization layer on the substrate to the at least one another contact area on the chip; applying a second insulating layer overlying the metallization layer on the at least one chip; applying at least one interfacial layer; applying at least one rigid substrate overlying the interfacial layer; and applying at least one secondary protective layer overlying the rigid substrate.

21 Claims, 17 Drawing Sheets

U.S. PATENT DOCUMENTS 7,030,432 B2   4/2006   Ma

OTHER PUBLICATIONS

W. Daum et al., "Overlay high density interconnect: A chips-first muitichip module technology", IEEE Computer, vol. 26, No. 4, pp. 23-29, Apr. 1993.

J.T. Butler et al., "Advanced Multichip Module Packaging of Microelectromechanical Systems", Tech Digest, Int. Conf. on Solid-State Sensors and Actuators, pp. 261-264, Chicago, IL, Jun. 16-19, 1997.

Analog Devices, Datasheet: "ADXL150/ADXL250 rev.0" Norwood, MA, 1996.

C. Hierold. Intelligent CMOS sensors. Proc. IEEE MEMS 2000, pp. 1-6, 2000.

P.F. van Kessel et al., A MEMS-based projection display. Proc. IEEE 86 (1998) pp. 1687-1704.

* cited by examiner

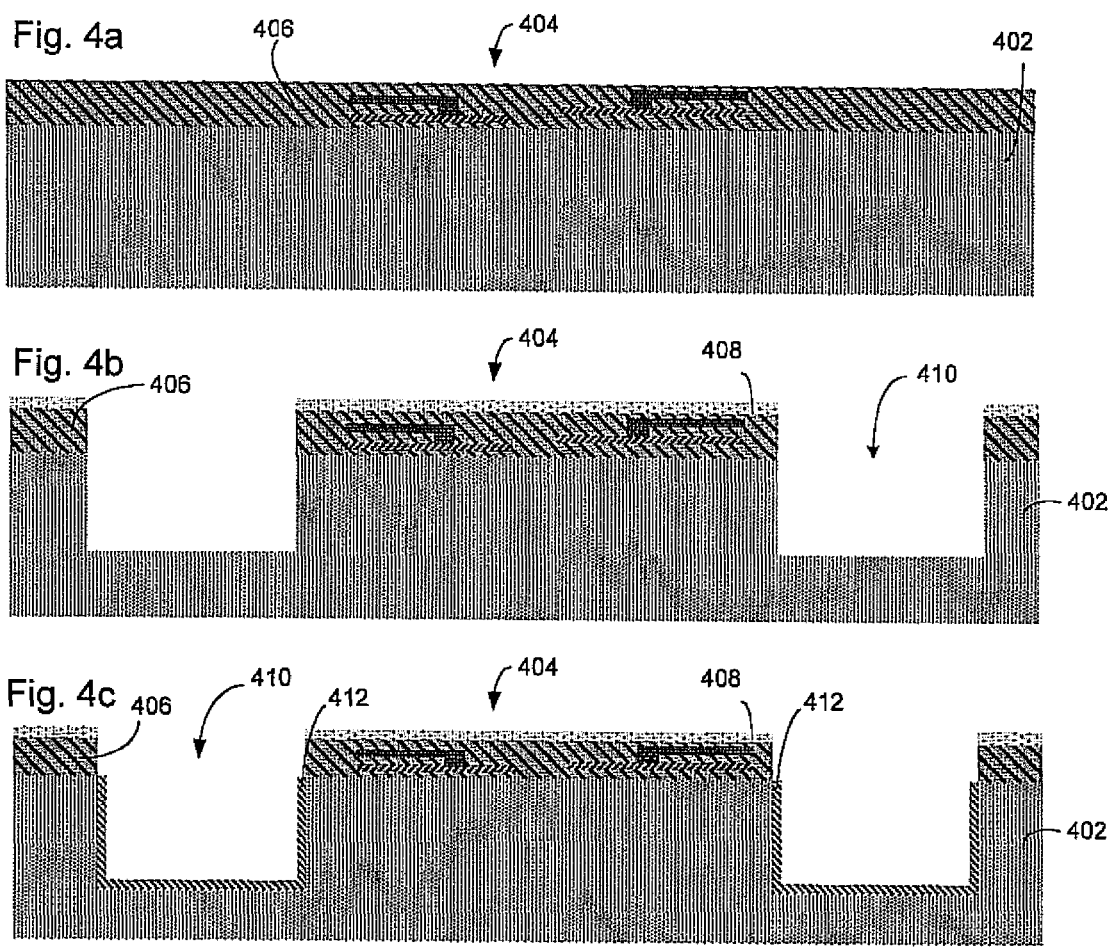

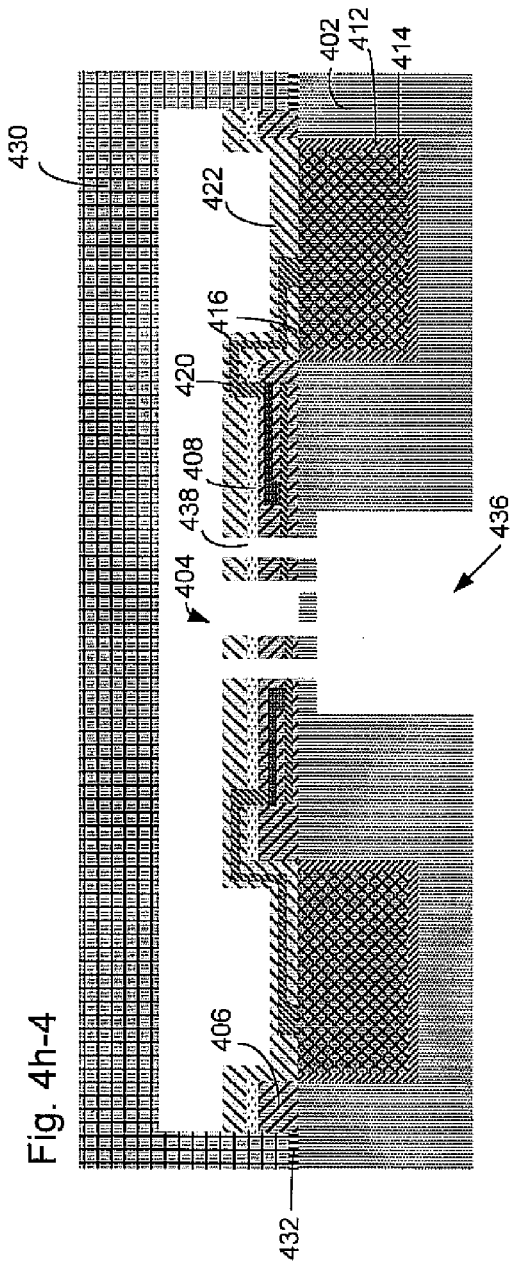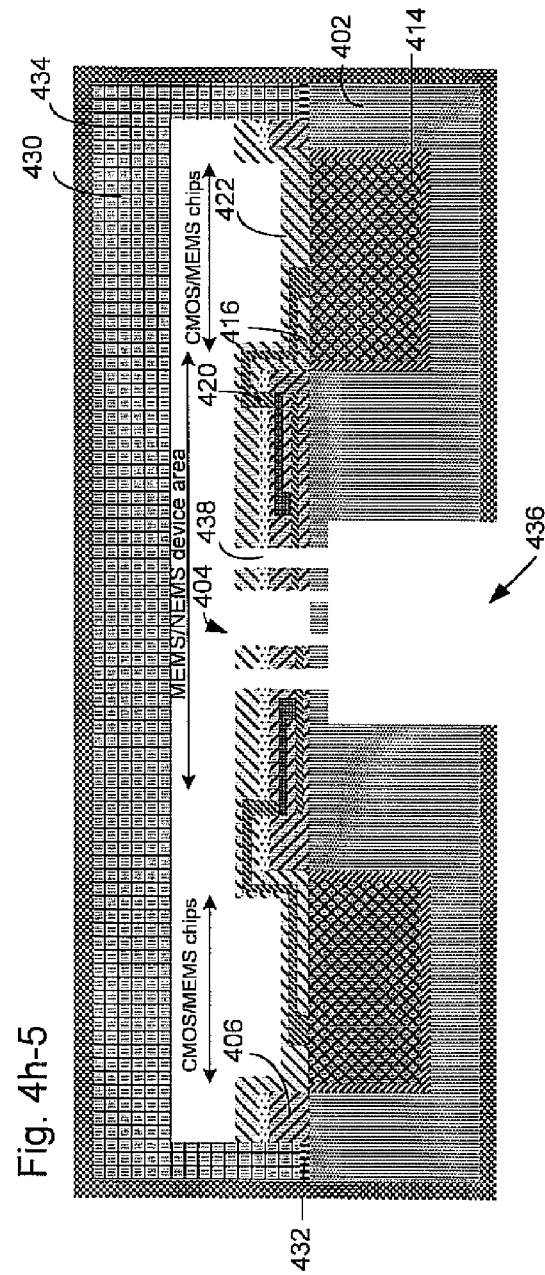

METHOD OF FORMING MONOLITHIC CMOS-MEMS HYBRID INTEGRATED, PACKAGED STRUCTURES

RELATED APPLICATIONS

This application is a continuation-in-part of co-pending U.S. patent application Ser. No. 12/497,107 filed Jul. 2, 2009 which is incorporated herein by reference.

FIELD OF THE INVENTION

The invention relates to a method for integrating MEMS and CMOS structures.

BACKGROUND OF THE INVENTION

Monolithic integration of MEMS/NEMS and electronics offers significant benefits enabling high volume production driving down the per-unit costs of sensor and actuator systems significantly. Micromechanical transducer systems not only need to receive analog and digital electrical inputs and transmit the output, but should also be able to measure rotation, strain, temperature, pressure, acceleration, infrared radiation, micro fluidic chemical properties of liquids and gasses. Effective integration offers other benefits, including, simplifying interconnect issues, reduced packaging and fabrication complexity and significantly improving the overall performance and ease of use for the device.

One method of monolithic integration of CMOS and MEMS is to modify the complementary metal-oxide semiconductor (CMOS) foundry facility to fabricate micromechanical structures. Some of the commonly used micromechanical (MEMS) mechanical structures like polysilicon, nitride etc require high-temperature processing during deposition and annealing to relieve stress and this cannot be performed on the same substrate in the presence of CMOS electronics due to the lower temperature limitation of the metals in CMOS. Another limitation of the method is that CMOS requires the substrate to be planar after the MEMS fabrication to achieve high-resolution features in the photolithographic process. Thus, the current CMOS-MEMS integration methodologies faces serious limitations, requiring sacrificing materials and allowing very little flexibility in device design.

Monolithic integration process may be divided into three classes: (1) Pre CMOS (2) Intermediate CMOS (3) Post CMOS. In prior art "pre CMOS" fabrication process methods, MEMS/NEMS structures are fabricated before the electronics are integrated. One example of this process is the micromechanics-first approach developed at Sandia National Laboratory by J. Smith et al. In this process a pre-etched trench is used to house the MEMS structures. After the fabrication of the desired MEMS structures, this housing is refilled with oxide, planarized using chemical-mechanical polishing (CMP), and finally sealed with a nitride membrane. Conventional CMOS processing was then carried out next to this MEMS area. This defined a CMOS device area and micromechanical device area on the same substrate as shown in FIG. 1. One of the disadvantages with this process is that it needs a dedicated production line and the process is complicated.

In the Intermediate CMOS fabrication process, the process flow between CMOS and MEMS is mixed in the sequence. Initially a part of the CMOS process is performed and then paused for additional thin film deposition or micromachining steps. Some of the commercially available sensors in this art include the Analog Devices integrated MEMS and Infineon's pressure sensor shown by C. Hierold. In the post CMOS process, MEMS/NEMS structures are fabricated after the CMOS or electronics is fabricated on the substrate. The disadvantage of this process is the temperature limitation of the process to below 400° C. to protect the aluminum in the electronics. This leads to the elimination of commonly used MEMS/NEMS high temperature materials like LPCVD polysilicon, silicon nitride etc.

An alternative approach to integration and packaging using high density interconnect (HDI) multichip modules (MCMs) was developed by researchers at GE Corporate Research and Development center as a "chips first" approach described in by W. Daum et al. as shown in FIG. 2. This process involves placing bare chips of MEMS test die and a generic CMOS electronics die into mechanically milled cavities on a base substrate and then fabricating the thin-film interconnect structure on top of the components. A computer-controlled argon ion laser system drills via holes through the polyimide film directly to the chip I/O pads. The interconnection metallization and via contacts were formed by a combined sputtering/electroplating process and patterned by computer-controlled adaptive laser lithography and etching. Some of the limitations with this process were the warping of the MEMS device due to excessive heating during the laser ablation step.

Prior art monolithic integration processes in this art involve utilizing complimentary metal-oxide semiconductor (CMOS) semiconductor layers to fabricate micromechanical structures is shown in U.S. Pat. No. 5,717,631, U.S. patent application Ser. No. 11/602,087, U.S. Pat. No. 6,060,336. Some of the major limitations with this approach involve the need to sacrifice MEMS/NEMS materials with various mechanical properties as commercial foundries cannot modify their processes to suit MEMS/NEMS. This also adds additional constraints when fabricating the MEMS/NEMS sensors or actuators as they would need to limit their processing techniques like etching, deposition so as to not harm the electronic circuits present on the substrate. Stress and other mechanical deficiencies may lead to device failure when the materials tailored to CMOS are modified as mechanical elements in MEMS.

Prior art hybrid MCM technology processes include putting one or several dies with different functionality into pre-fabricated trenches on a substrate, planarizing these chips, providing an insulator layer on top and forming electrodes have been demonstrated in U.S. Pat. Nos. 6,403,463, 6,780, 696 B1, 6,154,366, 6,759,270. Some of the major drawbacks in these prior art references include semiconductor substrates like silicon that are fragile and the devices need to be repackaged resulting in significant costs.

The invention describes a method of manufacture for Monolithic hybrid integration of CMOS-MEMS with enhanced flexibility of using materials without hindrance to process parameters. This invention enables this integration effectively without the need to sacrifice the inherent strengths of both the CMOS or MEMS technologies and bringing about their fusion in a hybrid approach on a common substrate. This invention also allows the ability to effectively package the entire system after integration.

Several of the limitations mentioned above are overcome in the present invention which describes a method to effectively synergize CMOS-MEMS/NEMS functionality and finally package them creating a very cost effective, reliable, robust transduction system In the present invention, protective layers are coated on the substrate to protect either the CMOS device area in the "Post CMOS" process or the MEMS device area in the "Pre CMOS" process to prevent damage to the sensor or electronics. Oxygen plasma etching can be used to open the vias to access conductive layers, being precisely defined by photolithography instead of laser which is known to cause damage in some of the previous integration approaches.

Either the "Post CMOS" or "Pre CMOS" fabrication may be carried out on a semiconductor substrate without compromising on the individual technologies strength and then integrating CMOS if MEMS is already present or MEMS if CMOS is already present on the same substrate.

The invention provides an improved ability to effectively package an entire system using a glass, silicon, plastic or metal housing. Packaging provides physical protection against external scratching and breakage, environmental protection and any other external forces that may damage the leads or the sensors. Effective packaging of the integrated system leads to lower cost, improved reliability and improved performance. This invention addresses some of the important issues present in current packaging methodologies. As one specific example related to reliability issues with plastic packages, the Thermal coefficient of expansion (TCE) mismatch resulting from the curing of the resins as they shrink in volume, creates a large temperature differential resulting in large strain mismatch, damaging the wire bonds. This issue can be eliminated or reduced significantly in the present invention as there will be no wire bonds involved and the fabrication is planar and the metal traces can be more effectively protected. The packaging methodology from the current invention also eliminates the need for solder bumps for integration of CMOS-MEMS and packaging. The invention also provides a method to further encapsulate the entire system by adding a secondary protective layer of organic materials providing a very effective packaging methodology.

SUMMARY OF THE INVENTION

Accordingly, the invention relates to a method of forming Monolithic CMOS-MEMS hybrid integrated structures. In one aspect, the method includes the steps of: providing a semiconductor substrate; applying at least one first insulating layer that is temperature independent to the semiconductor substrate with at least a portion of the first insulating layer being a sacrificial layer; applying at least one structural layer that is temperature independent to the first insulating layer with at least a portion of the structural layer being made conductive; patterning the structural layer and the insulating layer; applying at least one protective layer overlying both the patterned first insulating and structural layer; etching the first insulating and structural layer; forming at least one opening in the semiconductor substrate and the protective layer; applying at least one filler layer in the at least one opening on the semiconductor substrate; positioning at least one chip on the filler layer, the chip including a front face and a back face; applying at least one planarization layer overlying the substrate and the chip; forming at least one via opening on a portion of the planarization layer interfacing pads on the chip and the portion of the mechanical layer that is conductive on the substrate; applying at least one metallization layer overlying the planarization layer on the substrate and the chip connecting the metallization layer on the substrate to the at least one chip; applying at least one second insulating layer overlying the metallization layer; performing at least one micro/nano fabrication etching step with at least a portion of the first insulating layer that is the sacrificial layer.

In another aspect, the method includes the steps of: providing a semiconductor substrate; forming at least one portion of the semiconductor substrate to contain a patterned MEMS/NEMS sensing area comprising at least one first insulating layer that is temperature independent and at least one temperature independent structural layer with at least one portion being made conductive; attaching at least one IC/CMOS die in close proximity to the sensing area by positioning it into at least one opening formed through a portion of the semiconductor substrate by etching away the first insulating and structural layer; applying at least one planarization layer overlying the substrate, and the IC/CMOS die; forming at least one via opening on a portion of the planarization layer interfacing IC/CMOS die and the portion of the mechanical layer that is conductive on the substrate; applying at least one metallization layer overlying the planarization layer connecting the metallization layer on the substrate to the IC/CMOS die; applying at least one second insulating layer overlying the metallization layer.

BRIEF DESCRIPTION OF THE DRAWINGS

FIG. 4(h1-h5) is a cross-sectional view showing the post fabrication of the integrated CMOS MEMS realizing anisotropic etching in the front and backside and finally packaged;

DETAILED DESCRIPTION OF THE PREFERRED EMBODIMENTS

Referring to the various Figures there is shown an effective, reliable, and relatively low cost method of integration between CMOS-MEMS/NEMS.

In one embodiment of a "post CMOS" or "CMOS first" hybrid integration approach shown in FIGS. 3a-3h, the already fabricated CMOS semiconductor substrate is modified to achieve this integration. The CMOS device area is first protected so as not to affect their functionality in the ensuing process; fabrication is continued on the same substrate and integrated by coupling the micromechanical structures in a hybrid approach by placing the MEMS/NEMS dies that have been diced. The integrated system is finally packaged in an effective manner.

Figure 3A:
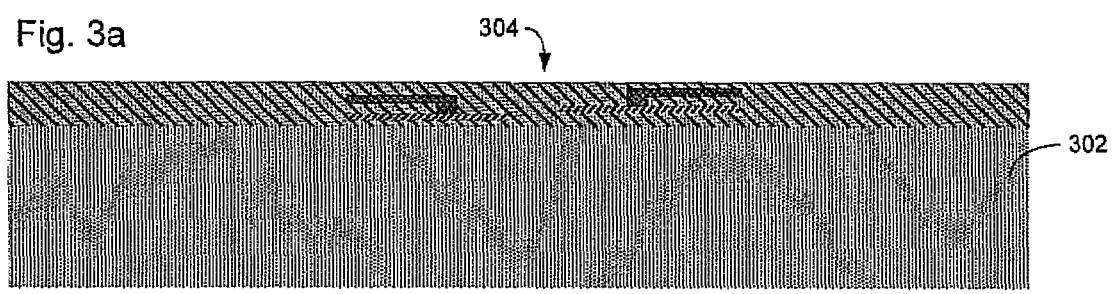
FIG. 3a-3h is a cross-sectional view showing the process flow for building a "post CMOS" monolithic CMOS-MEMS hybrid integration system and packaging.

Again referring to FIGS. 3a-h, there is shown a cross-sectional process flow for the "Post CMOS" monolithic hybrid integration approach on a semiconductor substrate 302. A CMOS fabricated semiconductor substrate 302 with dielectric layers and metallization in FIG. 3a is provided as a starting point in the integration process. The CMOS device area 304 may include digital logic circuits, operational amplifiers, inverters, analog and digital circuitry, digital switches, voltage comparators which enable the sensors and actuators to receive analog and digital signals for their effective operation.

Figure 3B:
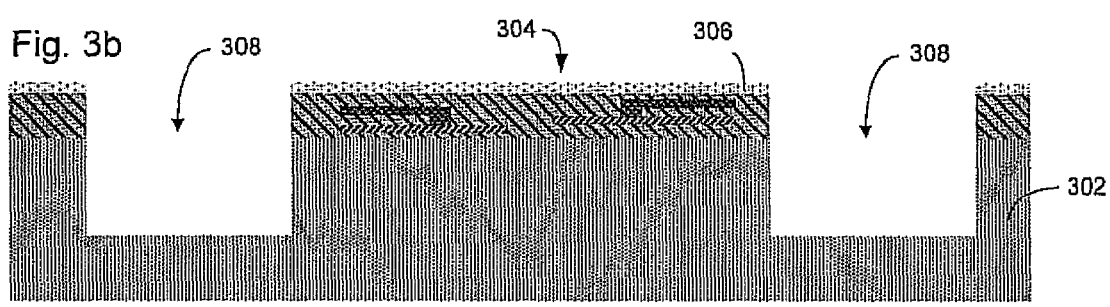

Next, as shown in FIG. 3b, a protective layer 306 may be applied to the CMOS semiconductor substrate 302 by either spin coated or deposited in vacuum to protect the CMOS area 304 from further processing steps. Protective layer 306 may be selected from oxides, nitrides, polymers, or their combination having a thickness of sub-microns to several microns and that which can effectively protect the electronics. The protective layer 306 may be selectively patterned using lithography and etched anisotropically using oxygen plasma RIE for materials such as polyimide and parylene to define a trench 308 outside of the CMOS device area 304. The trench 308 may be etched using DRIE Bosch process and may be lithographically defined by the size of a chip 312. The protective layer 306 may be left behind or removed.

Figure 3C:
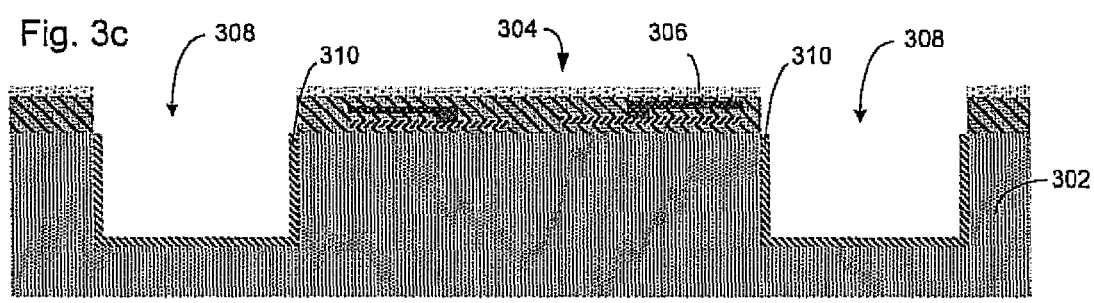

In a following step, as shown in FIG. 3c, a filler layer 310 may be deposited or dispensed into the trench 308 to anchor a chip 312 into the trench 308 and also to fill a gap between the chip 312 and the wall of the trench 308 and will also ensure the planarity of the chip 312 to the substrate 302. The filler material 310 may be selected from oxides, polyimides, silicones, epoxiess, or their combination or any other materials with similar properties.

Figure 3D:
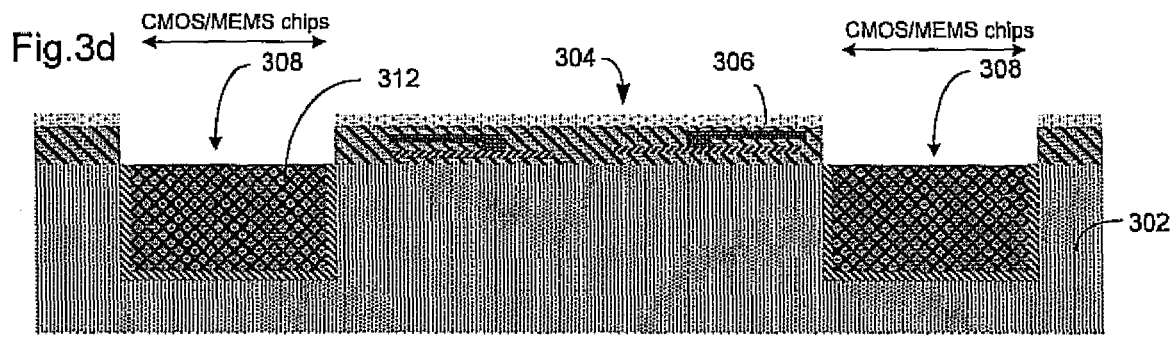

In a next step as shown in FIG. 3d, the chip 312 of CMOS, MEMS/NEMS or a combination of them may be placed in the trench 308. As described above, a CMOS integrated chip may include voltage comparators, diodes, op-amps, or other electronic components like power management circuits, resistors, capacitors, and inductors. A MEMS/NEMS dies may include but are not limited to accelerometers, resonators, micro-gyroscopes, microphones, micro-bolometers, transducers involving chemical and biological, optical, mechanical, radiation, thermal, capacitive, rotation, strain, magnetic and electromagnetic, flow, and micro-fluidic chemical properties of liquids and gases.

Figure 3E:
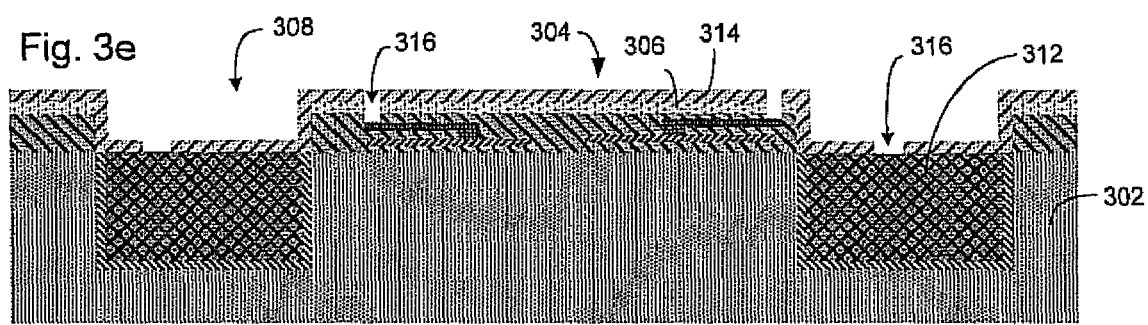

In a following step as shown in FIG. 3e, a first insulating layer 314 may be deposited covering the front face and/or the sides of the chip 312 providing the continuity from the semiconductor substrate 302 to the chip 312. The first insulating layer 314 may be selected from polymers, oxides, nitrides, glass, quartz polyimide, parylene, silicone, or a combination of the above. At least one via opening 316 may be etched through the first insulation layer 314 to make electrical contact. The first insulation layer 314 may be anisotropically etched using oxygen plasma or may be etched using wet or dry etching.

Figure 3F:
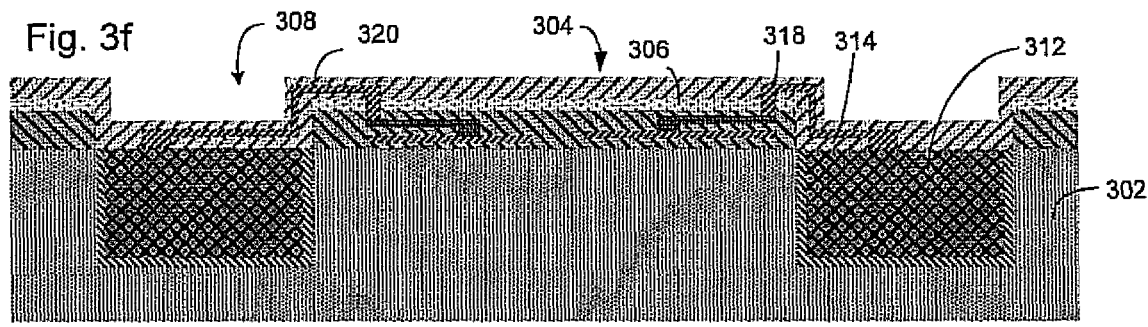

In a next step as shown in FIG. 3f, a metallization layer 318 may be applied to connect the CMOS area 304 on the semiconductor substrate 302 to the chip 312 which may include a contact area having an input/output pad or bond area to make electrical contact. The metallization layer 318 may be selected from metals such as, aluminum, copper, titanium, chrome, gold, silver, iridium or their combination that can be evaporated, sputtered or electroplated. A second insulating layer 320 may be deposited overlying the CMOS area 304 on the semiconductor substrate 302 covering the via 316 and overlying the metallization layer 318 on the chip 312. The second insulation layer 320 may be selected from polymers including polyimide, parylene, silicones, oxides, nitrides, glass, quartz or their combination. A person of ordinary skill in this art will be able to easily make further alterations and modifications in packaging after reading the present invention. It can easily be inferred that any particular embodiment illustrated with diagrams and explained cannot be considered limiting. For example the metallization layer 318 may include multiple layers sandwiched between multiple insulating layers 320 connecting multiple devices and/or multiple chips on the substrate.

Figure 3G:
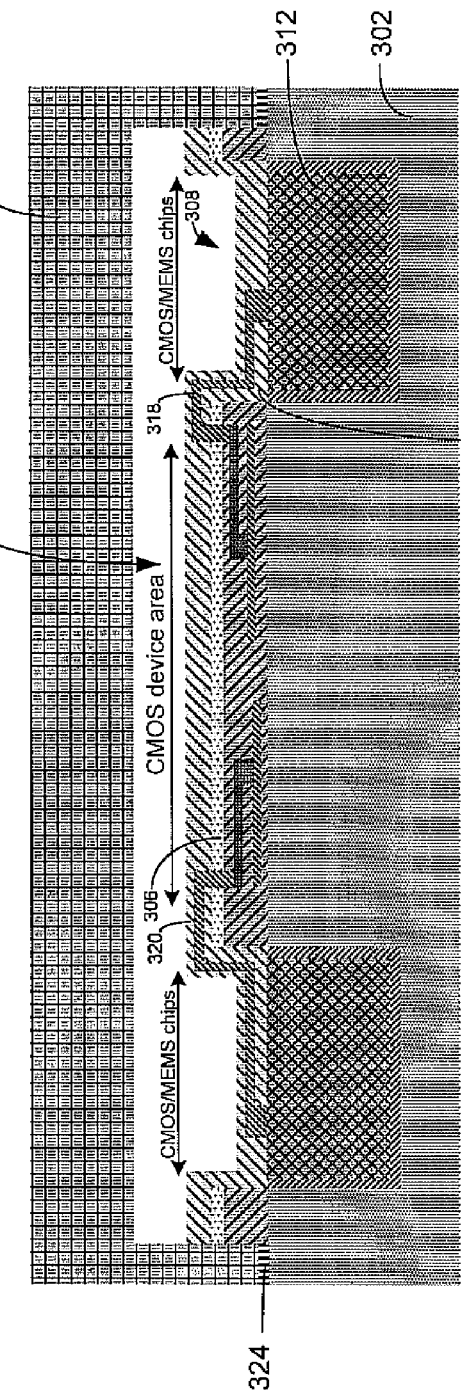

In a next step as shown in FIG. 3g, the packaging of the integrated device is detailed. The packaging of the device may include aligning a rigid substrate 322 and bonding it to the substrate 302 by using an interfacial material 324. The packaging substrate 322 may be selected from ceramics, thermoplastics, thermosets, glass, silicon, quartz, plastic or metals. The bonding may be anodic, eutectic, solder, polymer or fusion bonding. The interfacial material 324 may be selected from metal and/or alloys like gold, tin, epoxies like Benzo-cyclobuten (BCB) and SUB.

Figure 3H:
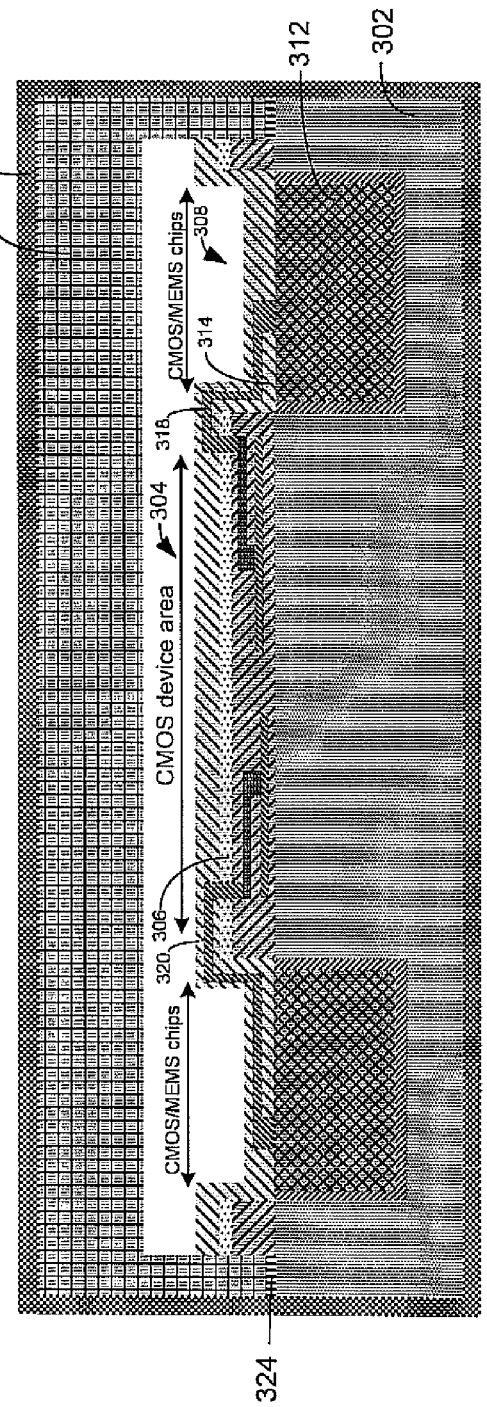

In a subsequent step as shown in FIG. 3h, a secondary protective layer 326 may be applied overlying the rigid substrate 322. The secondary protective layer 326 may be selected from polymers, oxides, nitrides, metals or a combination of them. A person of ordinary skill in this art will be able to easily make further alterations and modifications in packaging after reading the present invention.

Figure 4D:
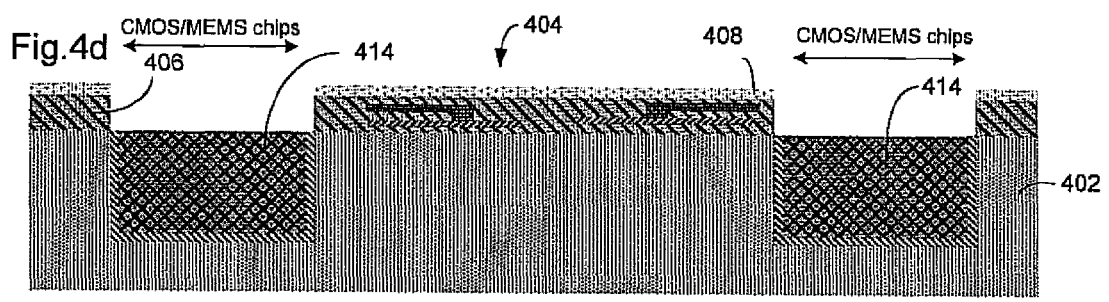
FIG. 4a-FIG. 4f is a cross-sectional view showing the process flow for building a "pre CMOS" monolithic CMOS-MEMS hybrid integration system.
Figure 4E:
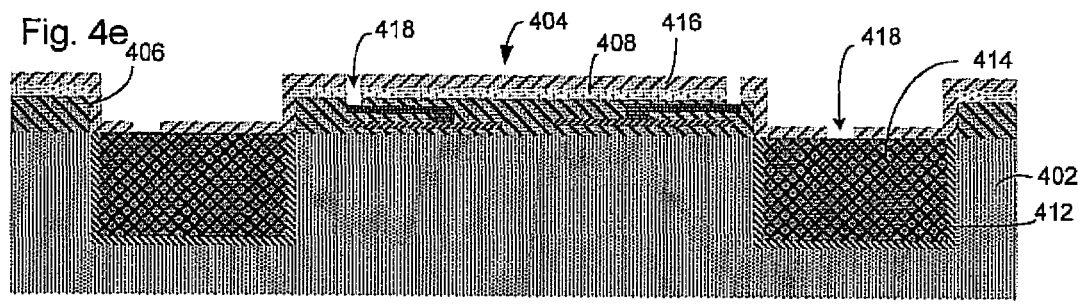
Figure 4F:
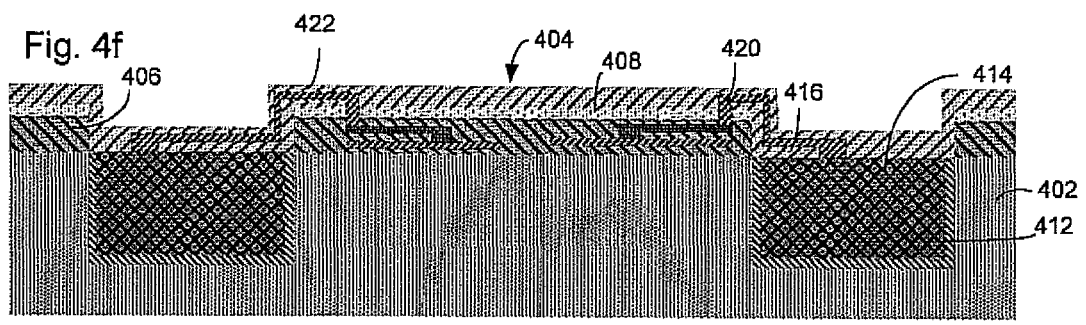
Figures 1, 4G:
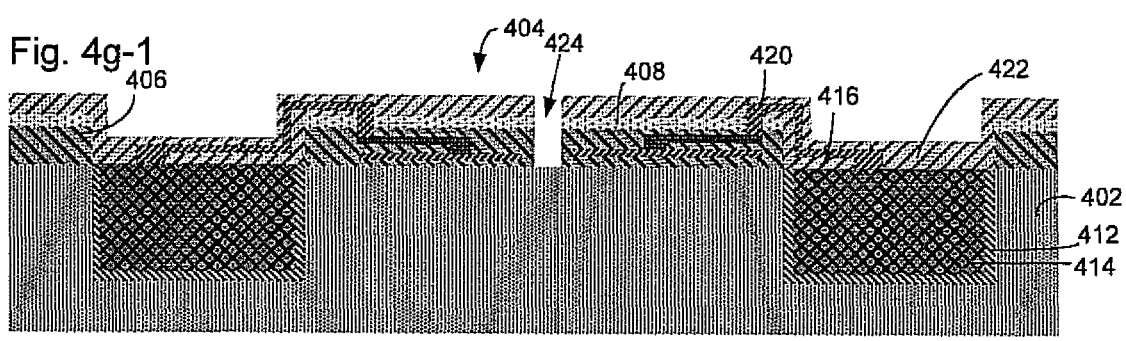
Figures 2, 4G:
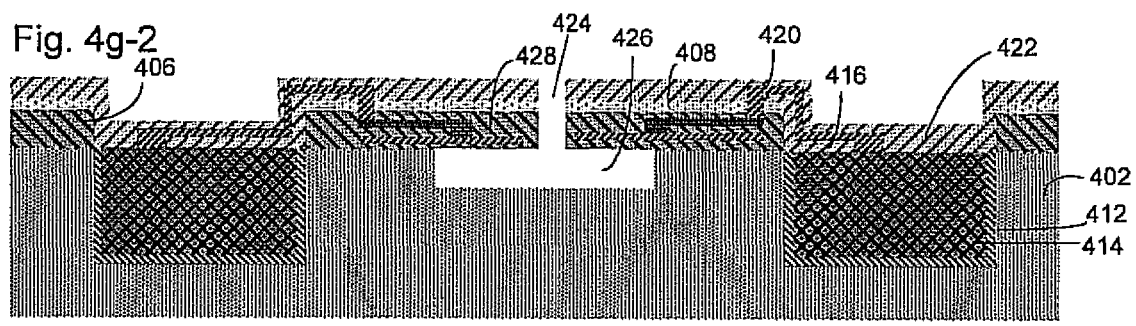
Figures 3, 4G:
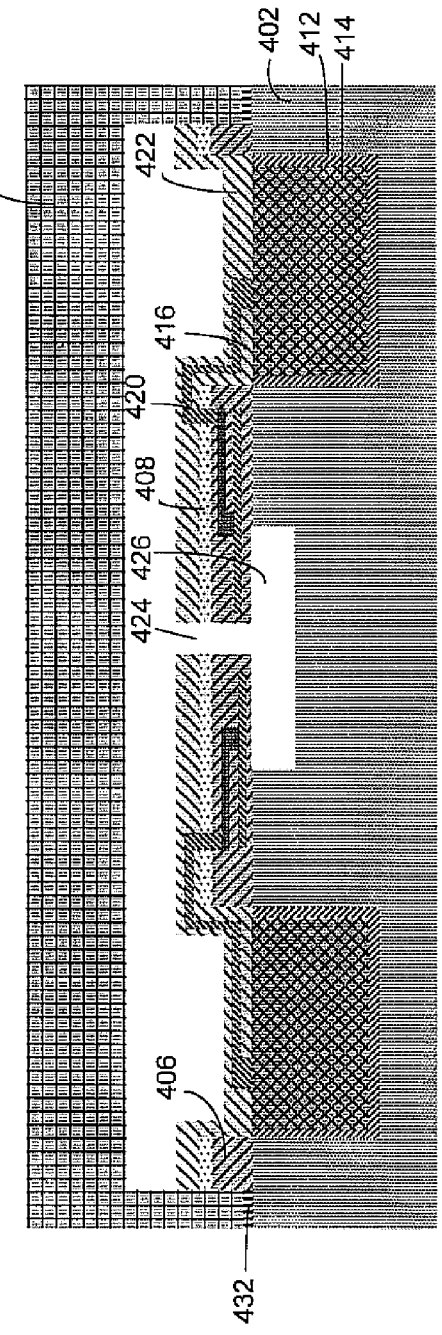
FIG. 4(g1-g4) is a cross-sectional view showing the post fabrication of the integrated CMOS MEMS realizing a suspended structure using isotropic etching and finally packaged.
Figures 4, 4G:
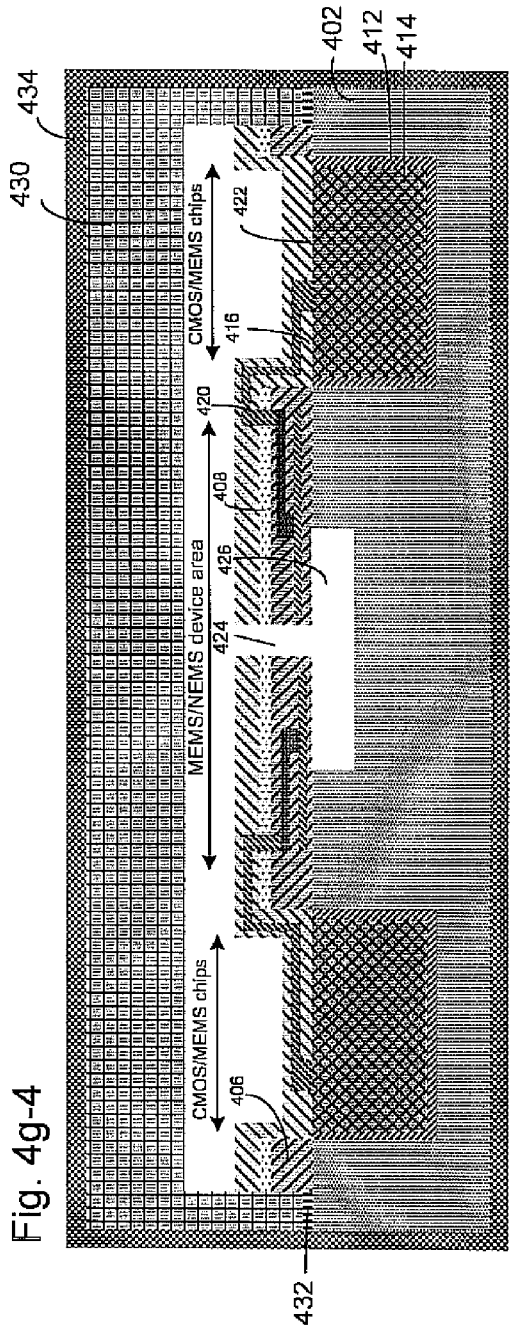

A second embodiment of a "Pre CMOS" monolithic hybrid integration approach is shown in FIG. 4. The second embodiment may include micromachined micromechanical systems involving high temperature materials including but not limited to LPCVD oxide, nitride and polysilicon to effectively fabricate transducers including but not limited to accelerometers, resonators, micro-gyroscopes, microphones, micro-bolometers, etc. A protective layer may be coated on the MEMS device area on the substrate to protect them from further fabrication steps that will be carried out on the same substrate. This protective layer protects the MEMS device area from the ensuing chemical etching. The CMOS electronics dies or any other MEMS/NEMS chips may be placed in a photolithographically etched trench with the help of a filler material and then connected to the already fabricated portion of the MEMS/NEMS device area with metallization evaporated or sputtered. The CMOS or electronic dies also involve more sophisticated circuits including digital interfaces and micro controllers. Thus the temperature limitation of the process to below 400° C. to protect the aluminum in the electronics, which has been the limiting step in some of the current integration methodologies, can now be overcome with the present invention with the potential to realize several novel devices. Processing can further resume on the MEMS device area by protecting the CMOS and or MEMS/NEMS chip areas and the MEMS/NEMS device area to realize a released structural layer and any other requirement depending on a specific application. It should be realized that a person of ordinary skill in this art will be able to make further alterations and modifications.

FIG. 4 illustrates a cross-sectional process flow for the "Pre CMOS" monolithic hybrid integration approach on a substrate 402.

Referring to FIG. 4a there is shown a first step including providing a substrate 402 that may be a semi-conductor insulator as described above. The substrate 402 may include MEMS/NEMS materials 404 applied thereon. In one aspect, the MEMS/NEMS material 404 that can be made conductive include high temperature MEMS materials such as LPCVD polysilicon that can be later doped in boron or phosphorous and or may also include LPCVD nitride and or metals such as aluminum, copper, titanium, chrome, gold, silver, iridium or their combination that can be evaporated, sputtered or electroplated. In the illustrated embodiment, a first insulating layer 406 may be applied to the MEMS/NEMS materials 404.

Next, as shown in FIG. 4b, a protective layer 408 may be applied to the semiconductor substrate 402 by either spin coating or depositing in vacuum to protect the MEMS/NEMS area 404 from further processing steps. Protective layer 408 may be selected from oxides, nitrides, polymers, or their combination having a thickness of sub-microns to several microns and that which can effectively protect the electronics. The protective layer 408 may be selectively patterned using lithography and etched anisotropically using oxygen plasma RIE for materials such as polyimide and parylene to define a trench 410 outside of the MEMS/NEMS area 404. The trench 410 may be etched using DRIE Bosch process and may be lithographically defined by the size of chips 414. The protective layer 408 may be left behind or removed.

In a following step, as shown in FIG. 4c, a filler layer 412 may be deposited or dispensed into the trench 410 to anchor the chip 414 into the cavity and also to fill a gap between the chip 414 and the wall of the trench 410 and will also ensure the planarity of the chip 414 to the substrate 402. The filler material 412 may be selected from oxides, polyimides, silicones, epoxies, or their combination or any other materials with similar properties.

In a next step as shown in FIG. 4d, the chip 414 of CMOS, MEMS/NEMS or a combination of them may be placed in the trench 410. As described above, a CMOS integrated chip may include voltage comparators, diodes, op-amps, or other electronic components like power management circuits, resistors, capacitors, and inductors. A MEMS/NEMS dies may include but are not limited to accelerometers, resonators, micro-gyroscopes, microphones, micro-bolometers, transducers involving chemical and biological, optical, mechanical, radiation, thermal, capacitive, rotation, strain, magnetic and electromagnetic, flow, and micro-fluidic chemical properties of liquids and gases In a following step as shown in FIG. 4e, a second insulating layer 416 may be deposited covering the front face and/or the sides of the chip 414 providing the continuity from the semiconductor substrate 402 to the chip 414. The second insulating layer 416 may be selected from polymers, oxides, nitrides, glass, quartz polyimide, parylene, silicone, or a combination of the above. At least one via opening 418 may be etched through the second insulation layer 416 to make electrical contact. The second insulation layer 416 may be anisotropically etched using oxygen plasma or may be etched using wet or dry etching.

In a next step as shown in FIG. 4f, a metallization layer 420 may be applied to connect the MEMS/NEMS on the semiconductor substrate 402 to the chip 414 which may include a contact area having an input/output pad or bond area to make electrical contact. The metallization layer 420 may be selected from metals such as, aluminum, copper, titanium, chrome, gold, silver, iridium or their combination that can be evaporated, sputtered or electroplated. A third insulating layer 422 may be deposited overlying the MEMS/NEMS on the semiconductor substrate 402 covering the via 418 and overlying the metallization layer 420 on the chip 414. The third insulation layer 422 may be selected from polymers including polyimide, parylene, silicones, oxides, nitrides, glass, quartz or their combination. A person of ordinary skill in this art will be able to easily make further alterations and modifications in packaging after reading the present invention. It can easily be inferred that any particular embodiment illustrated with diagrams and explained cannot be considered limiting. For example the metallization layer 420 may include multiple layers sandwiched between multiple insulating layers 422 connecting multiple devices and/or multiple chips on the substrate.

Figure 1:
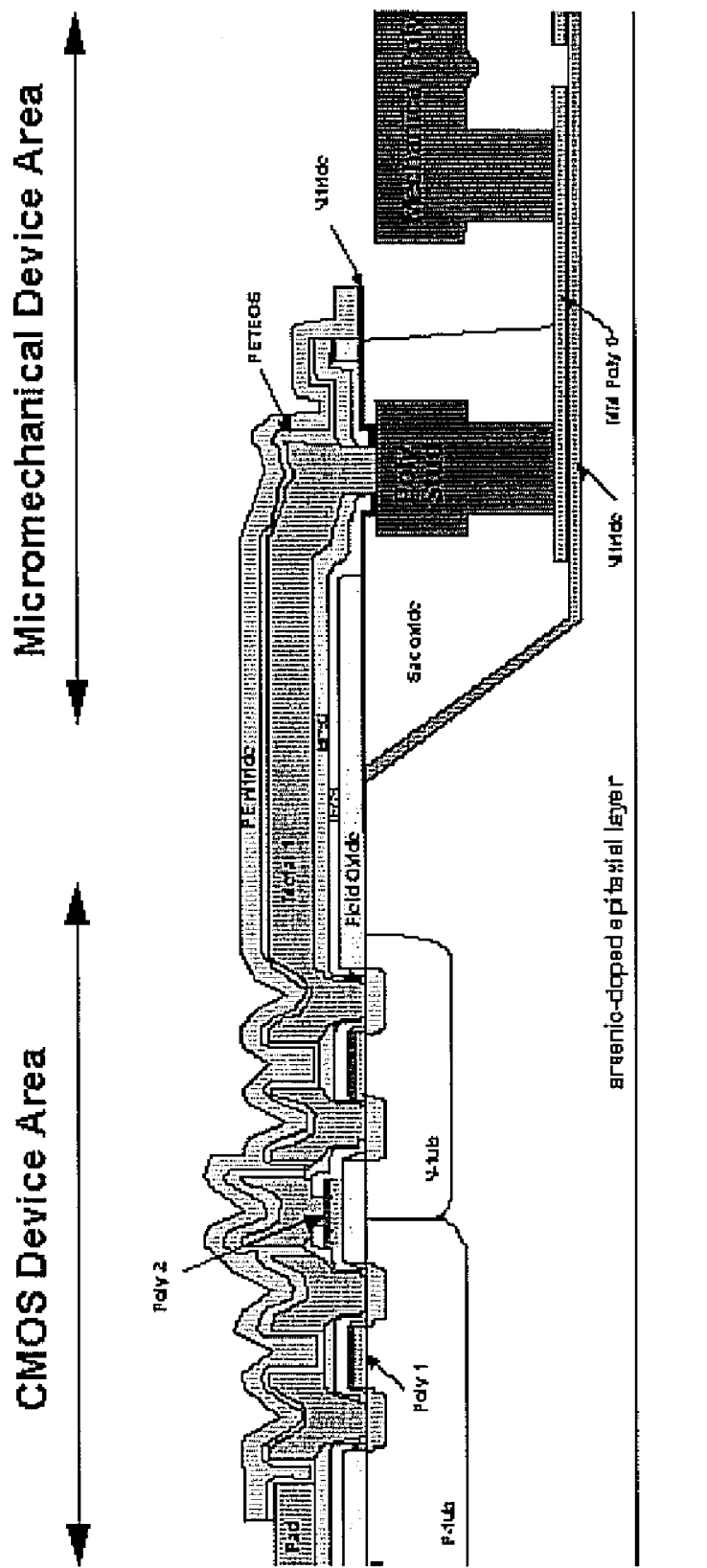
FIG. 1 Prior Art showing cross-section of the embedded micromechanics approach to CMOS/MEMS integration from Sandia National labs.
Figure 2:
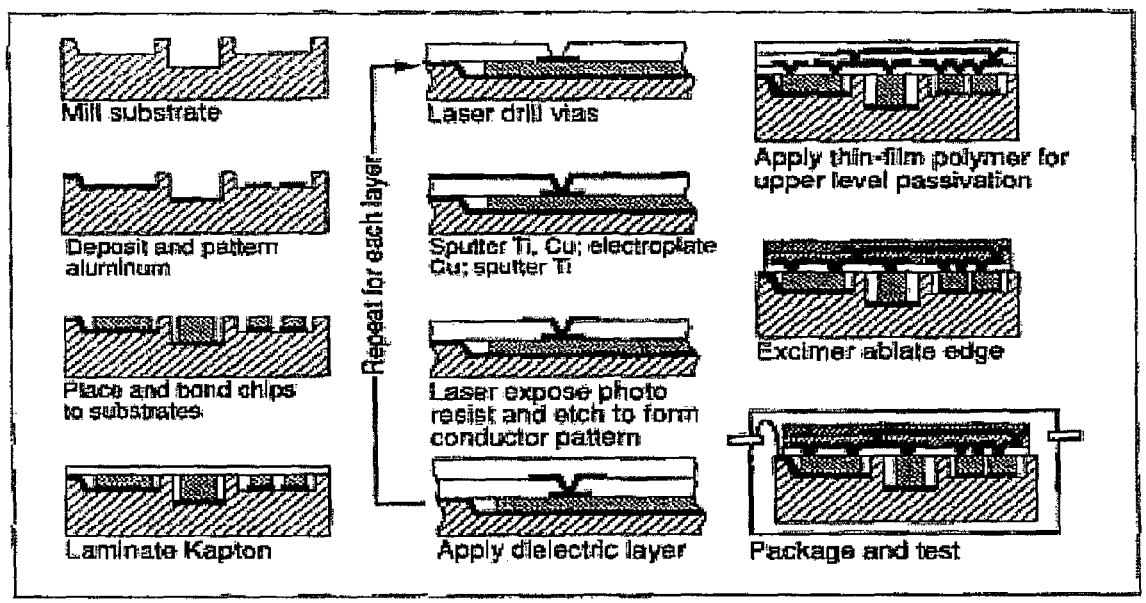
FIG. 2 Prior Art showing simplified cross-sectional view of HDI interconnect MCM technology from GE.

Referring to FIG. 4g-1 and FIG. 4g-2 there is shown a next step detailing a post micro/nano fabrication step after the integration to realize released mechanical structures 421. The third insulation layer 422 may provide a protective layer for the ensuing fabrication. In the detailed embodiment the insulating layers are patterned and etched to create an opening 424 on the substrate 402. The opening 424 may be formed by anisotropic etching. The mechanical structural layers of the MEMS/NEMS 404 can be released using an isotropic etch forming a cavity 426. The cavity 426 defines a sandwiched suspended structure 428.

In a next step as shown in FIG. 4g-3, the packaging of the integrated device is detailed. The packaging of the device may include aligning a rigid substrate 430 and bonding it to the substrate 402 by using an interfacial material 432. The packaging substrate 430 may be selected from ceramics, thermoplastics, thermosets, glass, silicon, quartz, plastic or metals. The bonding may be anodic, eutectic, solder, polymer or fusion bonding. The interfacial material 432 may be selected from metal and/or alloys like gold, tin, epoxies like Benzocyclobuten (BCB) and SU8.

In a subsequent step as shown in FIG. 4g-4, a secondary protective layer 434 may be applied overlying the rigid substrate 430. The secondary protective layer 434 may be selected from polymers, oxides, nitrides, metals or a combination of them. A person of ordinary skill in this art will be able to easily make further alterations and modifications in packaging after reading the present invention.

Figures 1, 4H:
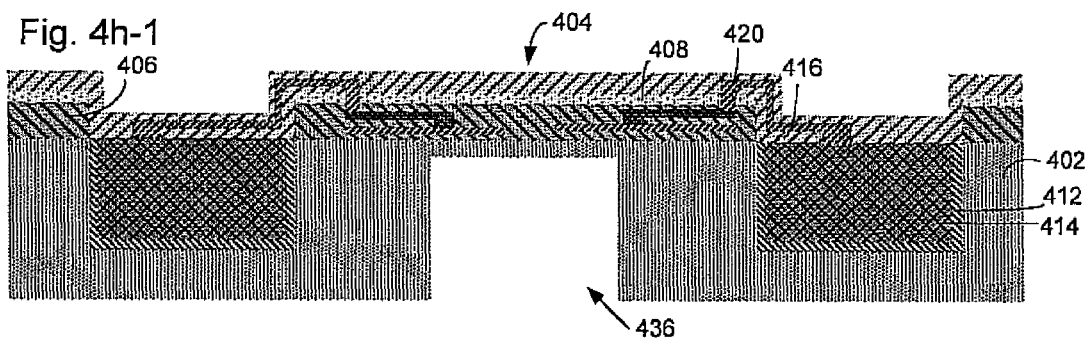
Figures 2, 4H:
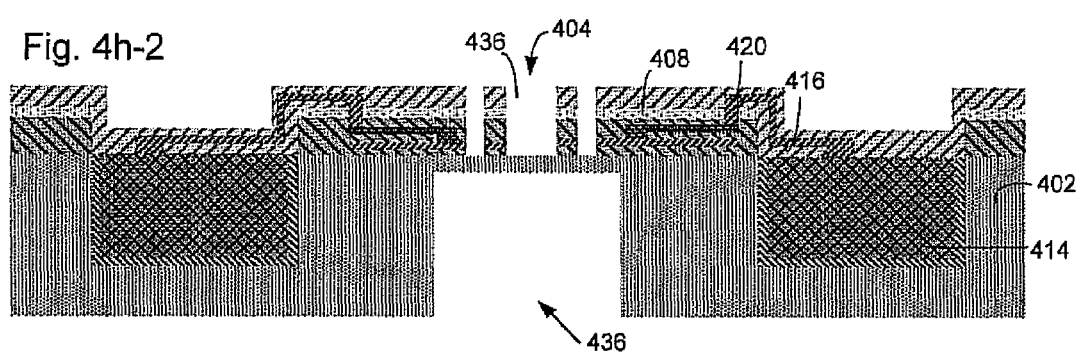
Figures 3, 4H:
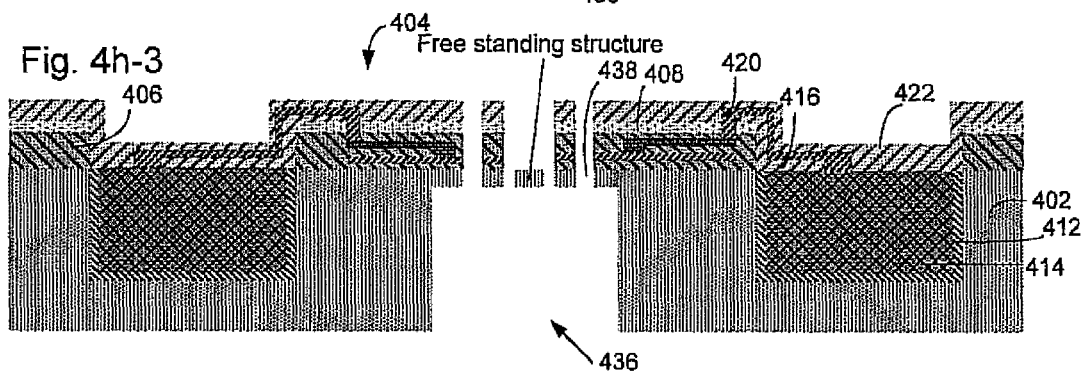

Referring to FIG. 4h-1 to FIG. 4h-3 there is shown an alternative embodiment of the post micro/nano fabrication step after the integration to realize released mechanical structures. The third insulation layer 422 may provide a protective layer for the ensuing fabrication. In the detailed embodiment, the backside of the substrate 402 is etched indicated by 436 and shown in FIG. 4h-1. In the ensuing fabrication the insulating layers may be patterned and etched to create several openings 436 on the substrate 402. The openings 436 may be formed by anisotropic etching. The mechanical structural layers of the MEMS/NEMS 404 can be released using another anisotropic etch shown in FIG. 4h-3, forming a free standing and or suspended structure 438.

In a next step as shown in FIG. 4h-4, the packaging of the integrated device is detailed. The packaging of the device may include aligning a rigid substrate 430 and bonding it to the substrate 402 by using an interfacial material 432. The packaging substrate 430 may be selected from ceramics, thermoplastics, thermosets, glass, silicon, quartz, plastic or metals. The bonding may be anodic, eutectic, solder, polymer or fusion bonding. The interfacial material 445 may be selected from metal and/or alloys like gold, tin, epoxies like Benzocyclobuten (BCB) and SU8.

In a subsequent step as shown in FIG. 4h-5, a secondary protective layer 434 may be applied overlying the rigid substrate 430. The secondary protective layer 434 may be selected from polymers, oxides, nitrides, metals or a combination of them. A person of ordinary skill in this art will be able to easily make further alterations and modifications in packaging after reading the present invention.

Referring to FIG. 5a-f there is shown another alternative embodiment in which opening and trench in the semiconductor substrate may be used interchangeably. FIG. 5 illustrates a cross-sectional process flow for a monolithic hybrid integrated piezoresistive strain gage on a substrate 502.

Figure 5A:
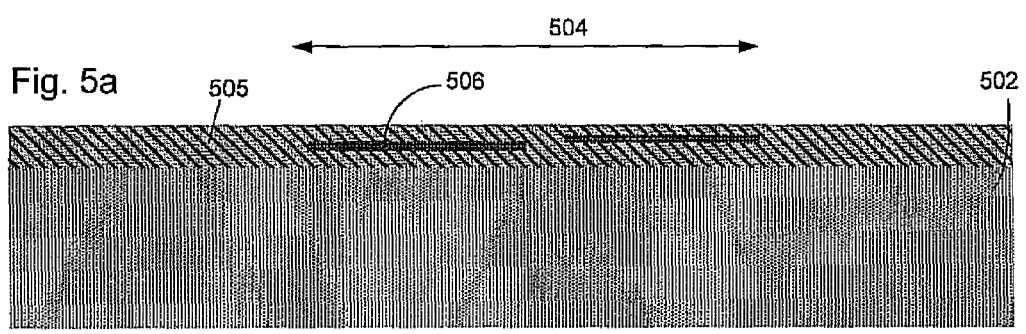
FIG. 5a-FIG. 5f is a cross-sectional view showing the process flow for building a monolithic CMOS-MEMS hybrid integrated polysilicon piezoresistive strain gage system.

Referring to FIG. 5a there is shown a first step including providing a silicon substrate 502. In this embodiment, a first insulating layer 505 may be a thermal silicon-dioxide deposited on the silicon substrate 502. The average thickness of the insulating layer may be about 0.54 microns. This is followed by the deposition of 0.5 microns of Low stress polysilicon 506 or structural layer which may be later boron doped and annealed to define the conductive sensing area. The first insulating layer 505 and the polysilicon layer 506 or structural layer are patterned to define the MEMS sensing area 504 which in this specific embodiment is the polysilicon piezoresistive sensing area.

Figure 5B:
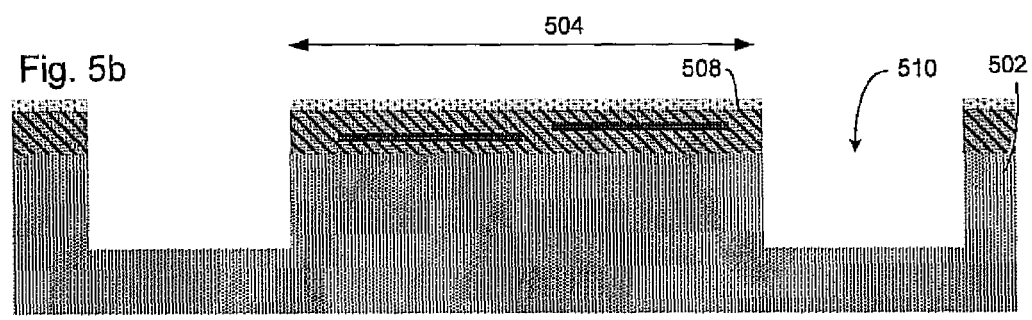

Next, as shown in FIG. 5b, a photo-resistive protective layer 508 may be applied to the semiconductor substrate 502 by either spin coating or depositing in vacuum to protect the MEMS/NEMS area 504 from further processing steps. Protective layer 508 may also be selected from oxides, nitrides, polymers, or their combination having a thickness of sub-microns to several microns which can effectively protect the electronics. The protective layer 508 may be selectively patterned using lithography to define an opening 510 in close proximity and outside of the MEMS/NEMS area 504. The trench 510 may be etched using DRIE Bosch process and may be lithographically defined by the size of the instrumentation amplifier chips 514. The protective layer 508 may then be removed.

Figure 5C:
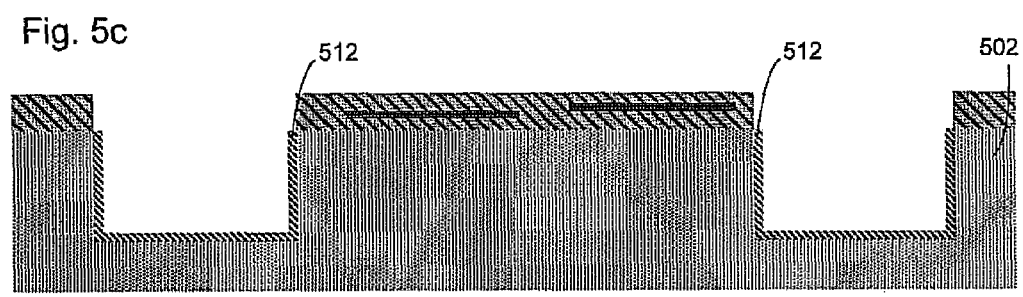

In a following step, as shown in FIG. 5c, a filler layer 512 may be deposited or dispensed into the trench 510 to anchor the chip 514 into the cavity and also to fill a gap between the chip 514 and the wall of the trench 510 and will also ensure the planarity of the chip 514 to the substrate 502. The filler material 512 may be selected from oxides, polyimides, silicones, epoxies, or their combination or any other materials with similar properties.

Figure 5D:
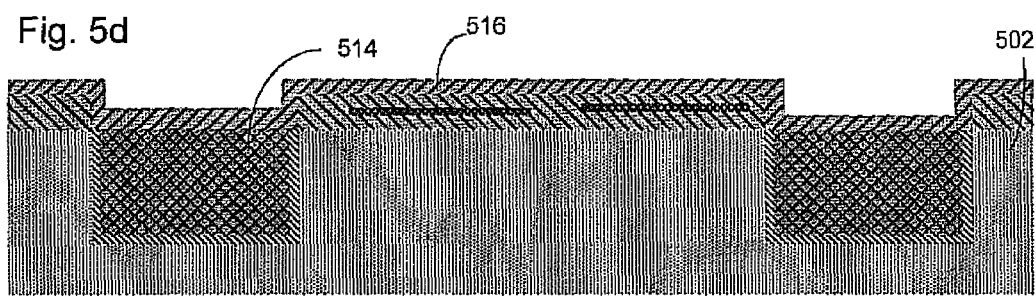

In a next step as shown in FIG. 5d, the chip or instrumentation amplifier die 514, is placed in the trench 510. In another aspect, the chip or die 514 may include, a CMOS integrated chip, voltage comparators, diodes, op-amps, or other electronic components such as power management circuits, resistors, capacitors, and inductors. The die 514 may also include MEMS/NEMS dies such as: accelerometers, resonators, micro-gyroscopes, microphones, micro-bolometers, transducers involving chemical and biological, optical, mechanical, radiation, thermal, capacitive, rotation, strain, magnetic and electromagnetic, flow, and micro-fluidic chemical properties of liquids and gases. It should be realized that various other MEMS/NEMS dies may also be included.

Figure 5E:
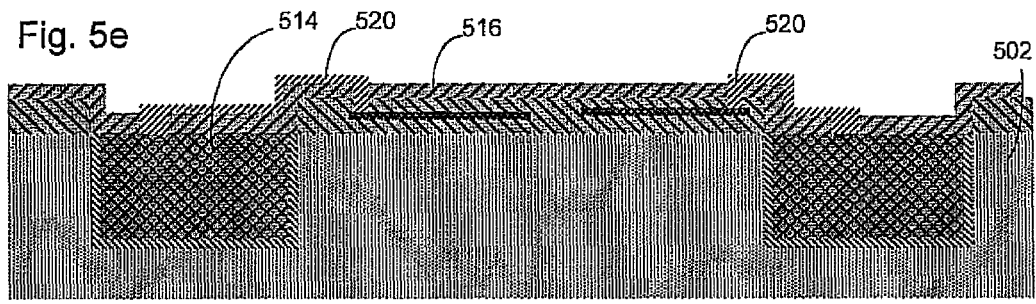
Figure 5F:
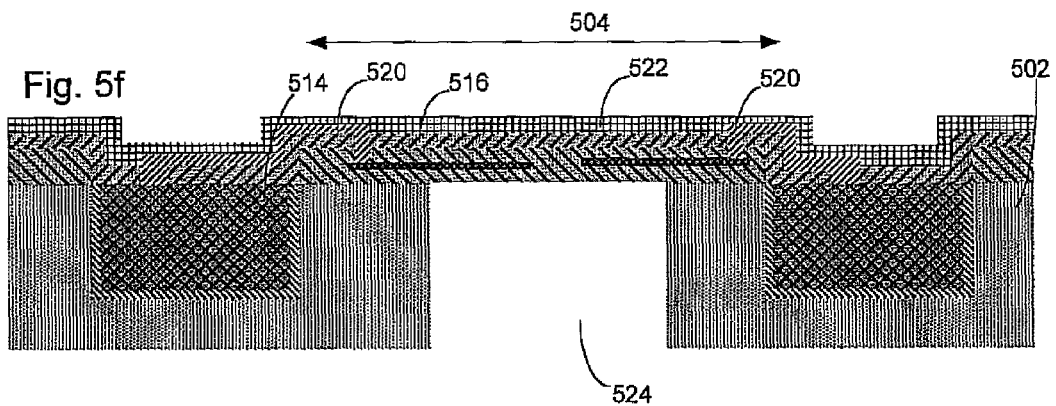
Figure 6:
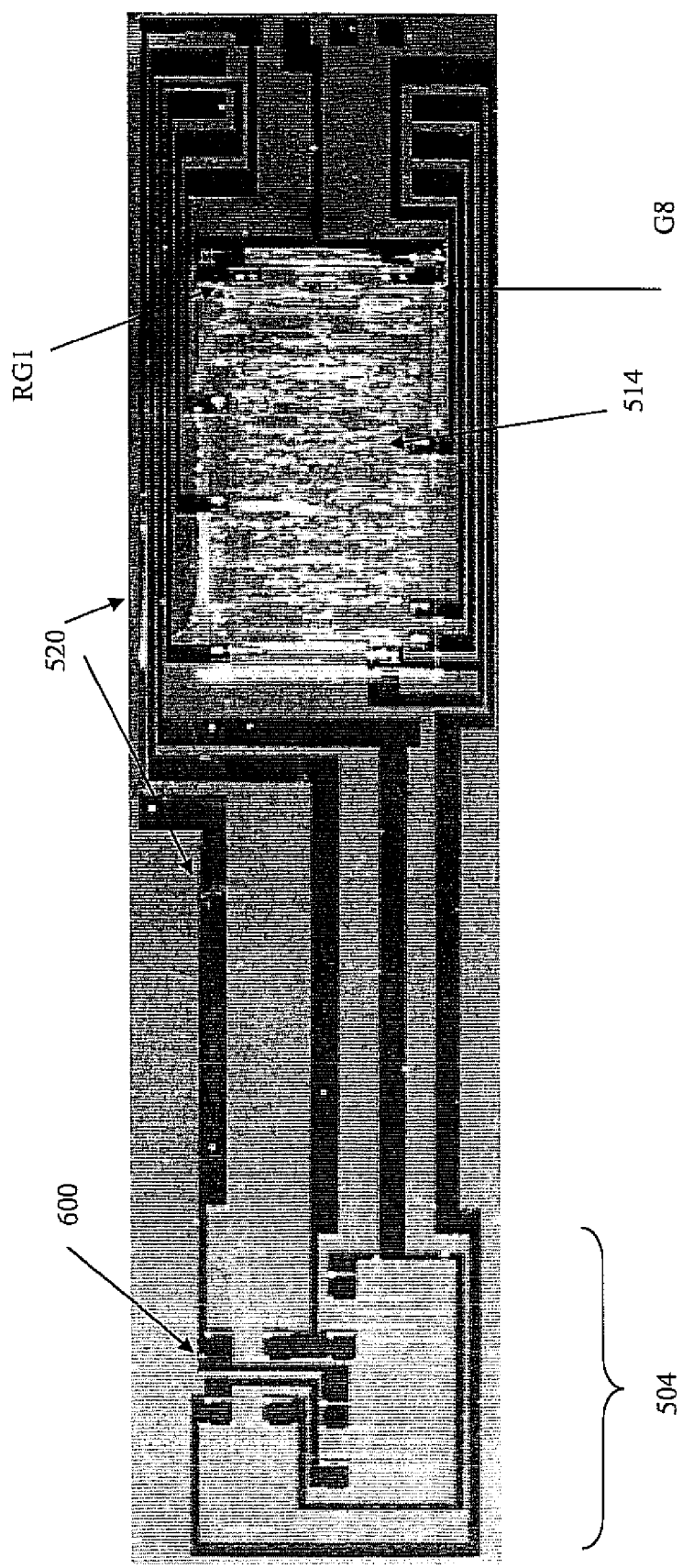
FIG. 6. is a micrograph showing the MEMS polysilicon strain gage connected to the AD621 instrumentation amplifier using electroplated, evaporated Au forming a integrated system.
Figure 7:
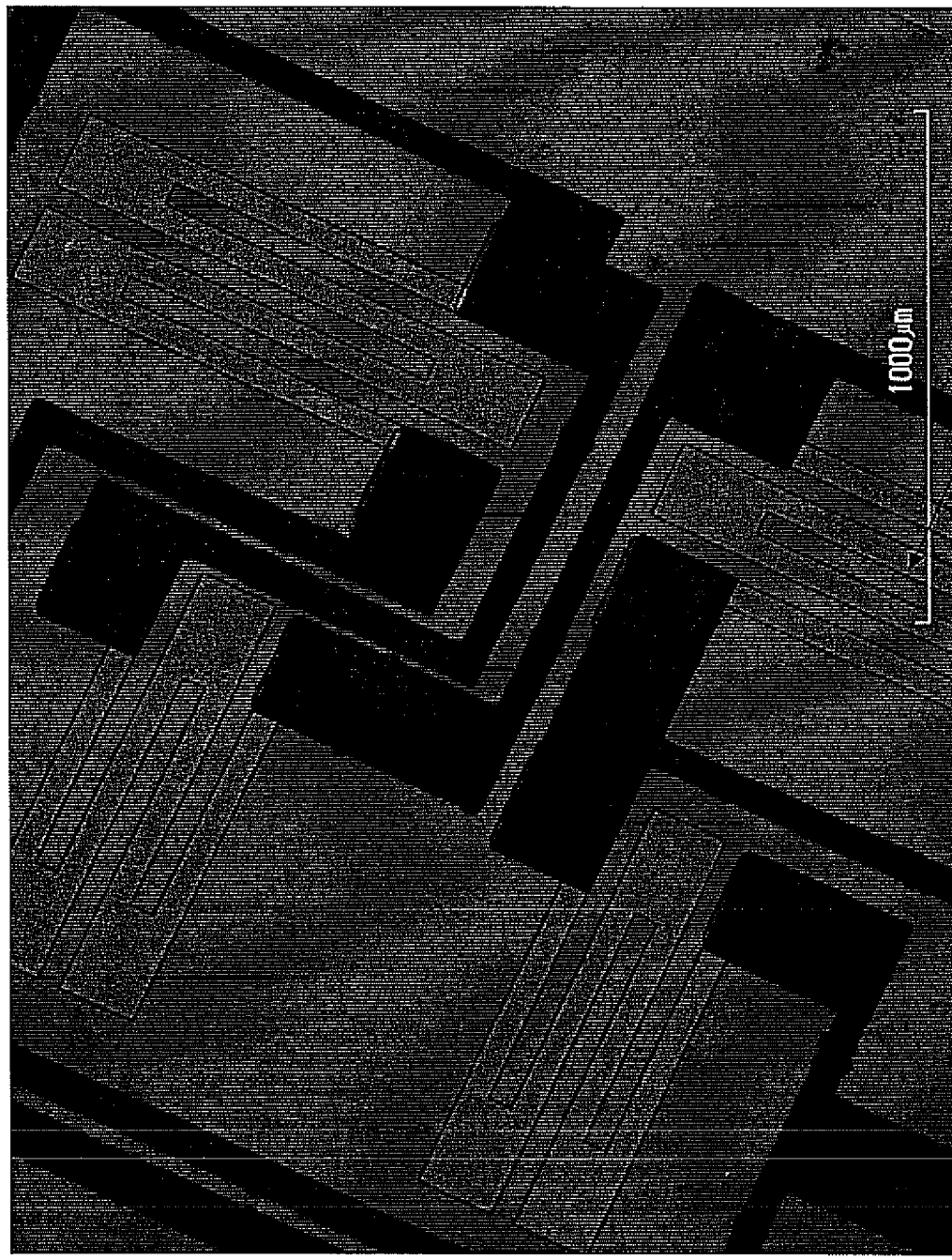
FIG. 7 is a micrograph showing the metallization created to form the wheatstone bridge using the MEMS based polysilicon piezoresistors.
Figure 8:
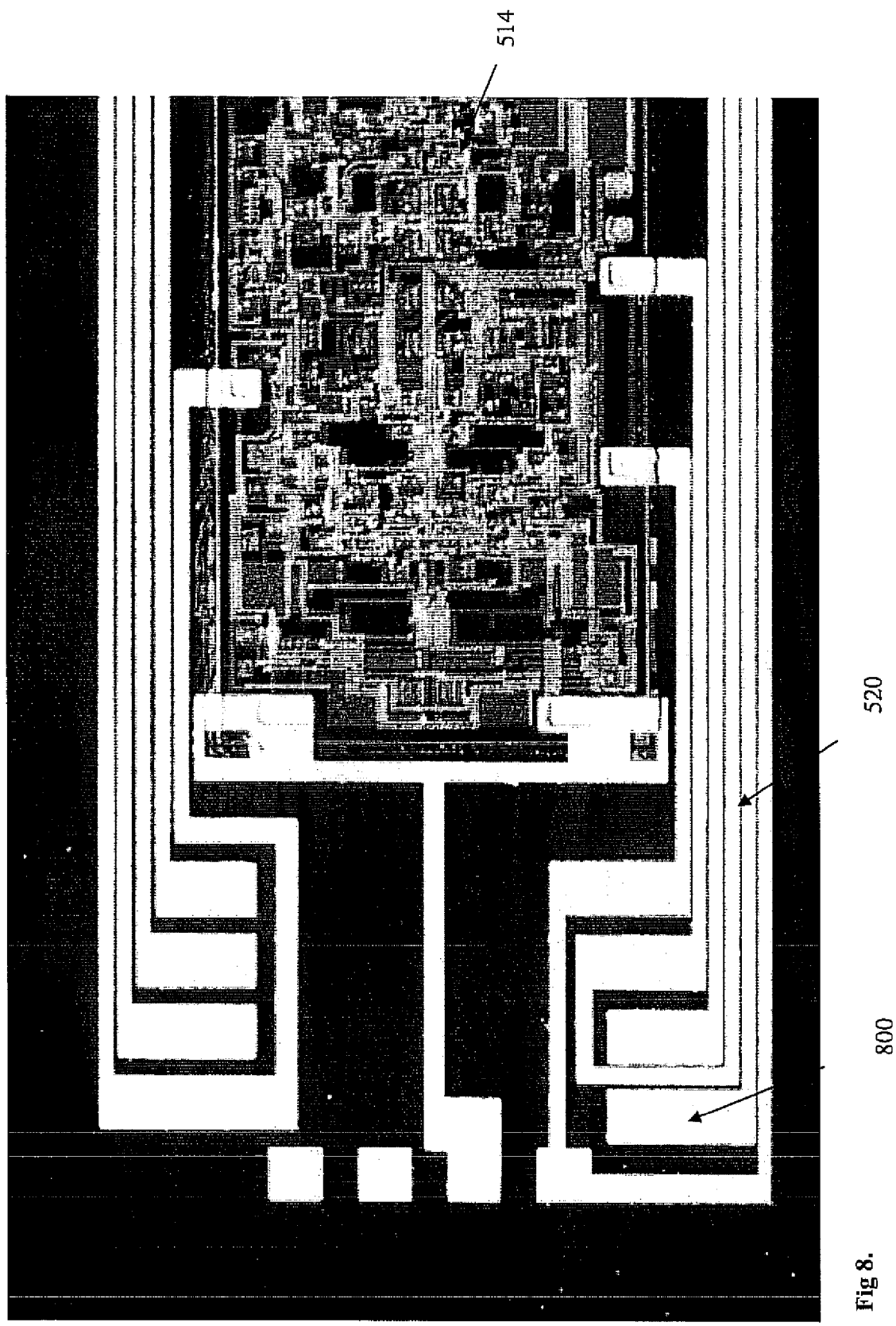
FIG. 8 is a micrograph showing the metallization connecting the Ad621 instrumentation amplifier to the output pads for external stimuli.

In a following step as shown in FIG. 5e, a planarization layer 516 may be deposited covering the front face and/or the sides of the chip 514 providing continuity from the semiconductor substrate 502 to the chip 514. In one aspect, the planarization layer 516 may be parylene. Alternatively the planarization layer 516 may be selected from polymers, oxides, nitrides, glass, quartz polyimide, and silicone.

In a next step as shown in FIG. 5e, a metallization layer 520 such as Ti/Au may be applied by e-beam evaporation and electroplated to connect the MEMS/NEMS on the semiconductor substrate 502 to the chip 514 which includes a contact area having an input/output pad or bond area to make electrical contact. Alternatively, the metallization layer 520 may be selected from metals such as, aluminum, copper, titanium, chrome, gold, silver, iridium or their combination that can be evaporated, sputtered or electroplated. A second insulating layer 522 may be deposited overlying the MEMS/NEMS on the semiconductor substrate 502, overlying the metallization layer 520 on the chip 514. The second insulation layer 522 may be selected from polymers including polyimide, silicones, oxides, nitrides, glass, quartz or their combination. In one aspect, an opening 524 on the substrate 502 may be formed to create a standing structure. The opening 524 may be formed by anisotropic etching. A person of ordinary skill in this art will be able to easily make further alterations and modifications in packaging after reading the present invention. It can easily be inferred that any particular embodiment illustrated with diagrams and explained cannot be considered limiting. For example the metallization layer 520 may include multiple layers sandwiched between multiple insulating layers 522 connecting multiple devices and/or multiple chips on the substrate.

Figure 9:
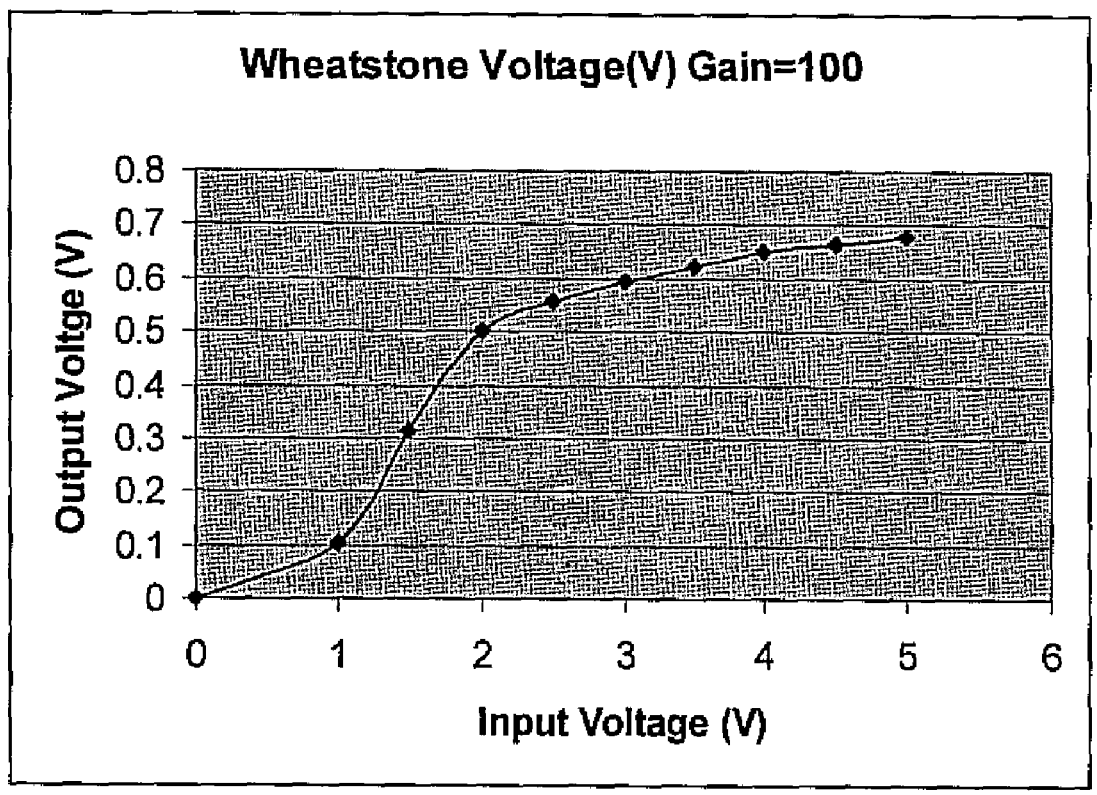
FIG. 9 shows the plot for the input voltage stimuli vs the output voltage response for the integrated piezoresistive strain gage system without any applied forces.

Referring to FIG. 6-9 there is shown an example of monolithic hybrid integration of a micro-machined polysilicon piezoresistive strain gage 600 integrated with an amplifier AD621 die 514. A first insulating layer 505 of thermal silicon-dioxide may be deposited on the silicon substrate 502. The average thickness measured using a Nanospec was 0.54 microns. This is followed by the deposition of 0.5 microns of Low stress polysilicon 506 which is later boron doped and annealed. The polysilicon 506 is first patterned defining the dimensions of piezoresistors 702. This is followed by patterning the thermal oxide 505 below to define an opening or trench 510 in the silicon substrate to place the amplifier die 514 with the dimensions of the pattern proportional to the length and breadth of the amplifier die 514. The patterned area of the polysilicon 506 and the thermal silicon-dioxide 505 define the MEMS area 504. Alternatively, micro-machined micromechanical systems having high temperature materials including but not limited to LPCVD oxide, nitride and polysilicon may be used to effectively fabricate transducers including but not limited to accelerometers, resonators, micro-gyroscopes, microphones, micro-bolometers, etc. A Photoresist protective layer 508 may be coated on the MEMS device area 504 on the substrate 502 to protect them from further fabrication steps that will be carried out on the same substrate 502. This protective layer is patterned to protect the MEMS device area from the ensuing chemical etching and defining the opening 510 in the silicon semiconductor substrate 502. The AD621 amplifier die 514 may be placed in the opening 510 which may be a photolithographically etched trench with a filler material 512. Next, the die 514 may be connected to the already fabricated portion of the MEMS/NEMS device area 504 with a metallization layer 520. The CMOS or electronic dies may also include more sophisticated circuits such as digital interfaces and micro controllers. FIG. 9 shows the data from testing the above embodiment. The testing setup involved wire bonding the output pads 800, shown in FIG. 8 to a Printed Circuit Board which was then mounted onto a Bread board for external connections. The only equipment required for the initial testing was the use of a Power supply and a Digital Multimeter. The MEMS piezoresistive Wheatstone bridge network 504 was connected to the inputs of the Ad621, 514 instrumentation amplifier using evaporated metal traces 520. These metal traces 520 not only ensured the output from the instrumentation amplifier but also set the gain of the amplifier to 100 by connecting the RG1 and RG8 pins on the chip 514 shown in FIG. 6. An external voltage stimuli was applied to the electronics chip 514 simultaneously powering the MEMS wheatstone network and the output recorded on the Digital Multimeter. This test was performed without any stresses applied.

In one aspect of integration, the processing temperature of the process for the CMOS component is below 400° C. to protect the aluminum in the electronics while other steps may have temperatures below or above this range without affecting the CMOS thereby defining a temperature independent process and the use of temperature independent materials, which has been a limiting step in prior art integration methodologies that is overcome with the present invention. For example, the application of the polysilicon material may be performed at a high temperature above 1000 degrees centigrade and will not destroy the component being produced. The process may also include protecting the MEMS device area by protecting the CMOS and or MEMSNEMS chip areas and the MEMS/NEMS device area to realize a released mechanical structural layer or other structures depending on a specific application.

While the above examples provide a description of the process of the present invention, they should not be read as limiting the process of the present invention. The invention has been described in an illustrative manner. It is to be understood that the terminology which has been used is intended to be in the nature of words of description rather than limitation. Many modifications and variations of the invention are possible in light of the above teachings. Therefore, within the scope of the appended claims, the invention may be practiced other than as specifically described.

The invention claimed is:

1. A method of forming a Monolithic CMOS-MEMS hybrid integrated, packaged device comprising the steps of:
   providing a semiconductor substrate;
   applying at least one first insulating layer that is temperature independent to the semiconductor substrate with at least a portion of the first insulating layer being a sacrificial layer;
   applying at least one structural layer that is temperature independent to the first insulating layer with at least a portion of the structural layer being made conductive;
   patterning the structural layer and the insulating layer;
   applying at least one protective layer overlying both the patterned first insulating and structural layer;
   etching the first insulating and structural layer;
   forming at least one opening in the semiconductor substrate and the protective layer;
   applying at least one filler layer in the at least one opening on the semiconductor substrate;
   positioning at least one chip on the filler layer, the chip including a front face and a back face;
   applying at least one planarization layer overlying the substrate and the chip;
   forming at least one via opening on a portion of the planarization layer interfacing pads on the chip and a portion of a mechanical layer that is conductive on the substrate;
   applying at least one metallization layer overlying the planarization layer on the substrate and the chip connecting the metallization layer on the substrate to the at least one chip;
   applying at least one second insulating layer overlying the metallization layer;
   performing at least one micro/nano fabrication etching step with at least a portion of the first insulating layer that is the sacrificial layer.

2. The method of claim 1, wherein the mechanical layer comprises polysilicon with the portion of the conductive area being doped and annealed.

3. The method of claim 1, wherein the first insulating layer comprises high temperature, 1000 degrees Centigrade or more deposited silicon-dioxide.

4. The method of claim 1, wherein the protective layer comprises Photoresist.

5. The method of claim 1, wherein the opening in the semiconductor substrate is formed by etching with Deep Reactive Ion Etching (DRIE).

6. The method of claim 1, wherein the filler layer is epoxy.

7. The method of claim 1, wherein the filler layer is selected from photo patternable materials including SU8, and PDMS.

8. The method of claim 1, wherein the at least one chip is selected from:
   CMOS integrated circuits, electronics, amplifier dies, analog to digital converters or diced chips from another MEMS/NEMS fabrication process.

9. The method of claim 1, wherein the planarization layer is selected from oxides, nitrides, glass, quartz, and polymers.

10. The method of claim 1, wherein the metallization layer is selected from aluminum, titanium, chrome, gold or platinum or a combination of the same that can be evaporated, sputtered or electroplated.

11. The method of claim 1, wherein the second insulating layer is selected from oxides, nitrides, glass, quartz, and polymers.

12. The method of claim 1, wherein the micro/nano fabrication etching step is selected from wet, dry, isotropic, and anisotropic etching.

13. The method of claim 1, wherein the micro/nano fabrication etching further comprises surface micromachining, bulk micromachining, dry etching, and chemical etching from a backside of the substrate.

14. A method of forming monolithic CMOS-MEMS hybrid integrated, packaged device comprising the steps of:
   providing a semiconductor substrate;
   forming at least one portion of the semiconductor substrate to contain a patterned MEMS/NEMS sensing area comprising at least one first insulating layer that is temperature independent and at least one temperature independent structural layer with at least one portion being made conductive;
   attaching at least one IC/CMOS die in close proximity to the sensing area by positioning it into at least one opening formed through a portion of the semiconductor substrate by etching away the first insulating and structural layer;
   applying at least one planarization layer overlying the substrate, and the IC/CMOS die;
   forming at least one via opening on a portion of the planarization layer interfacing IC/CMOS die and a portion of a mechanical layer that is conductive on the substrate;
   applying at least one metallization layer overlying the planarization layer connecting the metallization layer on the substrate to the IC/CMOS die;
   applying at least one second insulating layer overlying the metallization layer.

15. The method of claim 14, wherein the mechanical layer comprises polysilicon with the portion of the conductive area being doped and annealed.

16. The method of claim 14, wherein the first insulating layer comprises high temperature, 1000 degrees Centigrade or more deposited silicon-dioxide.

17. The method of claim 14, wherein the opening in the semiconductor substrate is formed by etching with Deep Reactive Ion Etching (DRIE).

18. The method of claim 14, wherein the at least one IC/CMOS die is selected from: CMOS integrated circuits, electronics, amplifier dies, Analog to Digital converters, or diced chips from another MEMS/NEMS fabrication process.

19. The method of claim 14, wherein the planarization layer is selected from oxides, nitrides, glass, quartz, and polymers.

20. The method of claim 14, wherein the metallization layer is selected from aluminum, titanium, chrome, gold or platinum or a combination of the same that can be evaporated, sputtered or electroplated.

21. The method of claim 14, wherein the second insulating layer is selected from oxides, nitrides, glass, quartz, and polymers.

* * * * *